(12) United States Patent
Yu et al.

(10) Patent No.: US 11,315,319 B2
(45) Date of Patent: Apr. 26, 2022

(54) METHOD FOR PRESERVING SHAPES IN SOLID MODEL WHEN DISTRIBUTING MATERIAL DURING TOPOLOGICAL OPTIMIZATION WITH DISTANCE FIELDS

(71) Applicant: Dassault Systemes SolidWorks Corporation, Waltham, MA (US)

(72) Inventors: Bowen Yu, Waltham, MA (US); Kyeong Hwi Lee, Waltham, MA (US); Shrikant Savant, Waltham, MA (US); Girish Mule, Waltham, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 0 days.

(21) Appl. No.: 15/931,806

(22) Filed: May 14, 2020

(65) Prior Publication Data
US 2021/0358207 A1    Nov. 18, 2021

(51) Int. Cl.
| | |
|---|---|
| *G06T 17/10* | (2006.01) |
| *G06T 15/08* | (2011.01) |
| *G06T 17/20* | (2006.01) |
| *G06T 19/20* | (2011.01) |
| *G06F 30/23* | (2020.01) |
| *G06F 30/10* | (2020.01) |
| *G06F 30/20* | (2020.01) |

(52) U.S. Cl.
CPC .............. *G06T 17/10* (2013.01); *G06T 15/08* (2013.01); *G06T 17/205* (2013.01); *G06T 19/20* (2013.01); *G06F 30/10* (2020.01); *G06F 30/20* (2020.01); *G06F 30/23* (2020.01); *G06T 17/20* (2013.01)

(58) Field of Classification Search
None
See application file for complete search history.

(56) References Cited

U.S. PATENT DOCUMENTS

| | | | |
|---|---|---|---|
| 10,635,088 B1 * | 4/2020 | Bandara | B33Y 50/02 |
| 2006/0025976 A1 | 2/2006 | Kennon | |

(Continued)

OTHER PUBLICATIONS

Bendse, Martin P. "Optimal Shape as a material distribution problem." Structural optimization 1.4 (1989): 193-202.

(Continued)

*Primary Examiner* — YuJang Tswei
(74) *Attorney, Agent, or Firm* — Sheehan Phinney Bass & Green PA

(57) ABSTRACT

A method preserves shapes in a solid model when distributing material during topological optimization. A 3D geometric model of a part having a boundary shape is received. The geometric model is pre-processed to produce a variable-void distance field and to produce a frozen distance field representing the boundary shape. The geometric model is apportioned into a plurality of voxels, and a density value is adjusted for each voxel according to an optimization process. An iso-surface mesh is extracted from the voxel data, and an iso-surface distance field is generated from the extracted iso-surface mesh. A distance field intersection is derived between the iso-surface distance field and the variable-void distance field. A distance field union is performed between the distance field intersection and the frozen distance field, and a result iso-surface mesh is produced from the distance field union.

7 Claims, 13 Drawing Sheets

(56) References Cited

U.S. PATENT DOCUMENTS

| | | | |
|---|---|---|---|
| 2008/0040080 A1 | 2/2008 | Bae | |
| 2015/0193559 A1* | 7/2015 | Musuvathy | B29C 64/386 703/1 |
| 2015/0269289 A1* | 9/2015 | Kim | G06F 30/20 703/6 |
| 2017/0024931 A1* | 1/2017 | Sheffer | G06F 17/11 |
| 2017/0372480 A1* | 12/2017 | Anand | G06T 19/20 |
| 2020/0150623 A1 | 4/2020 | Bandara et al. | |
| 2020/0272131 A1* | 8/2020 | Wang | G05B 19/4099 |

OTHER PUBLICATIONS

Bendsge, Martin P., and Ole Sigmund. "Material interpolation schemes in topology optimization." Archive of applied mechanics 69.9-10 (1999): 635-654.

Lorensen, William E., and Harvey E. Cline. "Marching cubes: A high resolution 3D surface construction algorithm." ACM siggraph computer graphics. vol. 21. No. 4. ACM, 1987.

Hoffmann, Christoph M. "Geometric and solid modeling." (1989).

Requicha, Aristides AG, and Herbert B. Voelcker. "Boolean operations in solid modeling: Boundary evaluation and merging algorithms." Proceedings of the IEEE 73.1 (1985): 30-44.

Pavic, Darko, Marcel Campen, and Leif Kobbelt. "Hybrid booleans." Computer Graphics Forum. vol. 29. No. 1. Oxford, UK: Blackwell Publishing Ltd, 2010.

Bernstein, Gilbert, and Don Fussell. "Fast, exact, linear booleans," Computer Graphics Forum. vol. 28. No. 5. Oxford, UK: Blackwell Publishing Ltd, 2009.

Breen, David E., Sean Mauch, and Ross T. Whitaker. "3D scan conversion of CSG models into distance volumes." IEEE Symposium on Volume Visualization (Cat. No. 989EX300). IEEE, 1998.

Gibson, Sarah F. Frisken. "Using distance maps for accurate surface representation in sampled volumes." IEEE Symposium on Volume Visualization (Cat. No. 989EX300). IEEE, 1998.

Huang, Jian, et al. "An accurate method for voxelizing polygon meshes." IEEE Symposium on Volume Visualization (Cat. No. 989EX300), Ieee, 1998.

Kobbelt, Leif P., et al. "Feature sensitive surface exfraction from volume data," Proceedings of the 28th annual conference on Computer graphics and interactive techniques. ACM, 2001.

Ju, Tao, et al. "Dual contouring of hermite data." ACM transactions on graphics (TOG). vol. 21. No. 3. ACM, 2002.

Botsch, Mario, et al. "Polygon mesh processing". AK Peters/CRC Press, 2010.

Extended European Search Report dated Oct. 1, 2021 for Application 21173926.3.

F.S. Nooruddin etal; "Simplification and repair of ploygonal models using volumetric techniques", IEEE Transactions on Visualization and Computer Graphics, vol. 9, No. 2, Apr. 1, 2003, pp. 191-205.

Hetroy, F., et al.; "Mesh repair with user-friendly topology control", Computer-Aided Design, Elsevier Publishers BV, Barking, GB; vol. 43, No. 1, Jan. 1, 2011; pp. 101-113.

Nguyen, Cong et al.; "Triangular mesh and boundary representation combined approach for 3D Cad lightweight representation for collaborative product development"; Journal of Computing and Information Science in Engineering, American Society of Mechanical Engineers, New York, NY vol. 19, No. 1, Jan. 1, 2019.

* cited by examiner

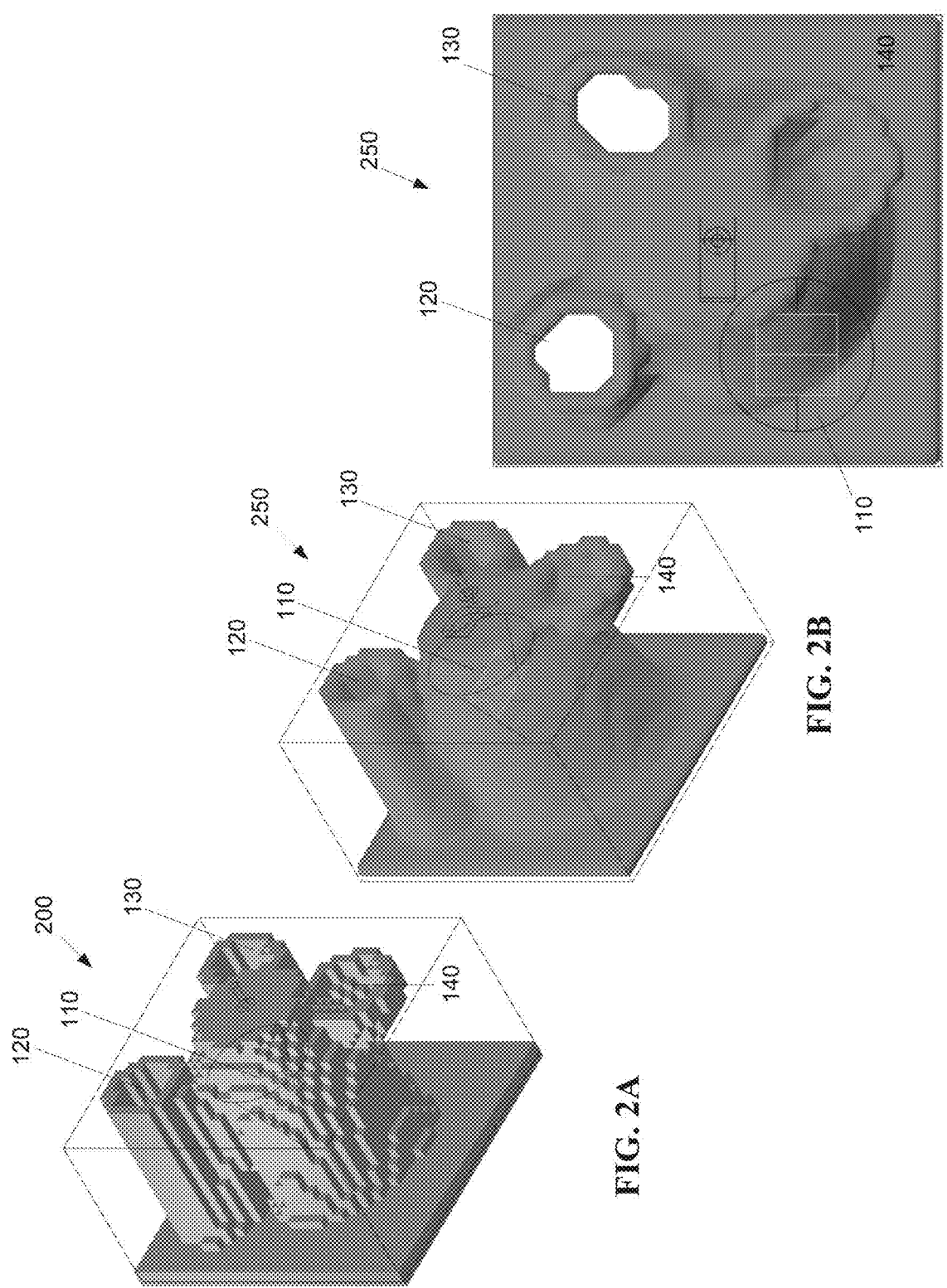

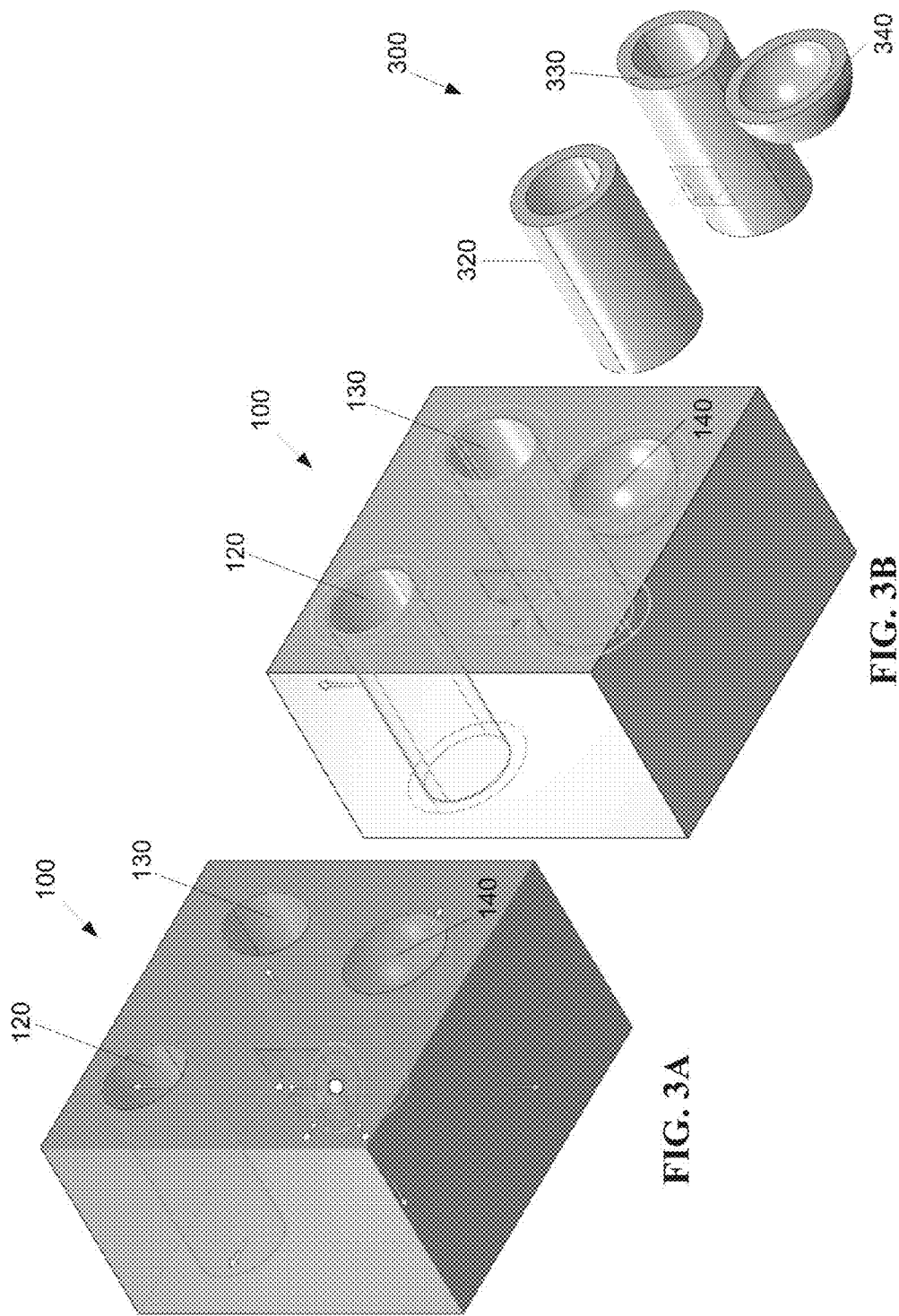

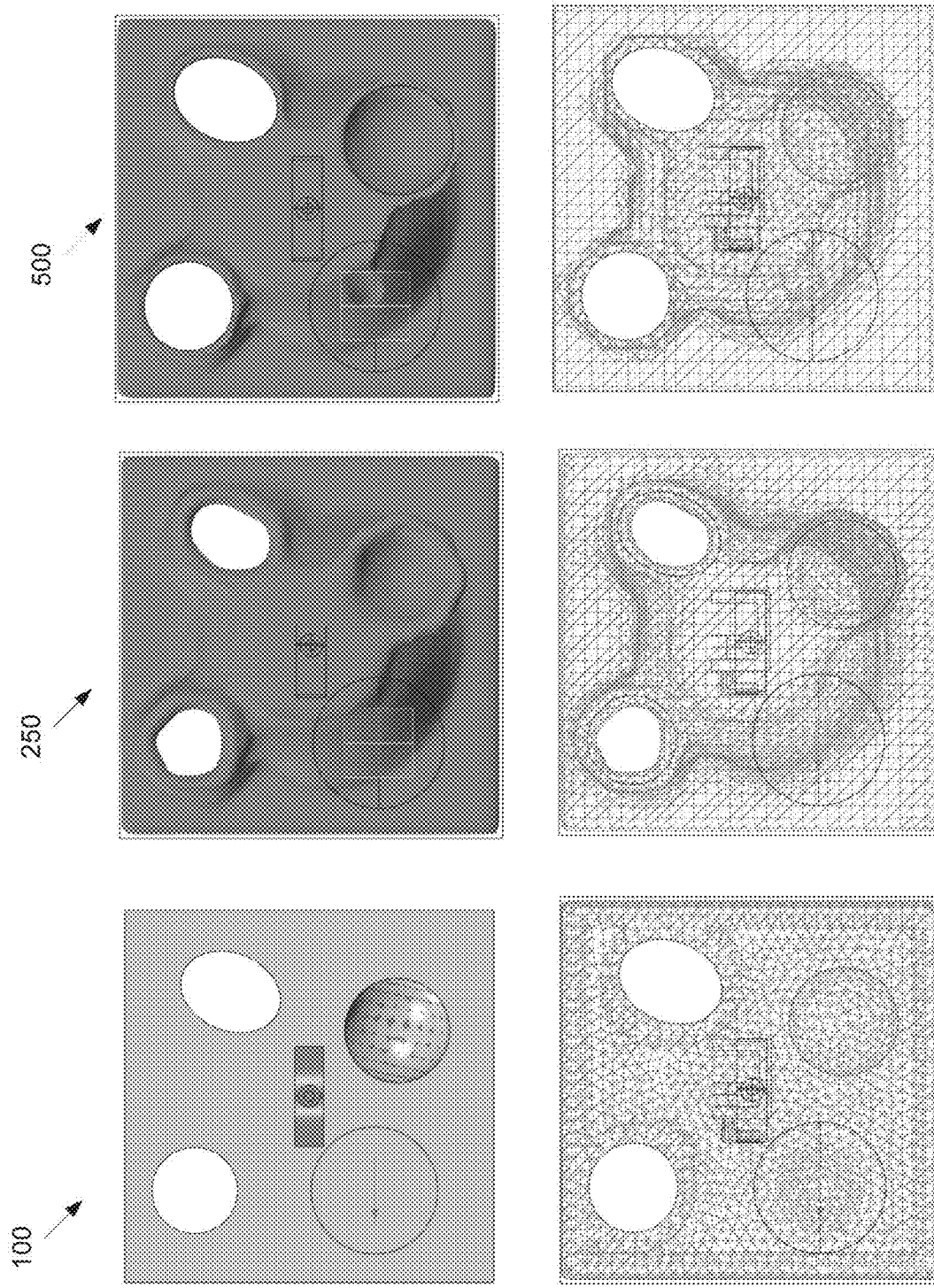

METHOD FOR PRESERVING SHAPES IN SOLID MODEL WHEN DISTRIBUTING MATERIAL DURING TOPOLOGICAL OPTIMIZATION WITH DISTANCE FIELDS

FIELD OF THE INVENTION

The present invention relates to computer aided drafting, and more particularly, is related to topology optimization.

BACKGROUND OF THE INVENTION

In computer aided design (CAD), 3D geometric models are described in computers based on geometric modeling and solid modeling methods. Based on physical loading conditions, topology optimization can be used to optimize material distribution in 3D models, for example, to reduce mass while maintaining performance while under load. The resulting geometric shapes can be used as a reference for further CAD design. A modeled part, for example, a 3D modeled part may initially be defined from a block of material having specific boundary shapes, for example, holes and/or cutoffs. Various performance constraints may be placed on the part, for example a directional load (point of force) and or exterior dimension limits. In some scenarios, it is desirable to re-form the part to retain the boundary shapes and conform to the performance parameters while reducing volume and/or mass of the finished part.

Currently, this topology optimization is performed by processing the model of the part that is represented by 3D elements such as hexahedral elements represented as a quad mesh or tetrahedral elements represented as a triangle mesh. For example, topology optimization may be performed using TOSCA, a powerful and popular topology optimization software package by Dassault Systemes, for example in the 3DExperienceplatform. Topology optimization of TOSCA in 3DExperience starts with a regular FEM problem with regular FEM elements, loads and restraints. Topology optimization uses the same finite elements (e.g. hexahedron, tetrahedron . . . ) to iteratively redistribute the density in the elements. However, the complexity of the calculations involving re-mapping of 3D models that may have many hundreds or thousands of FEM elements may be computationally intensive, resulting in excessive use of computational resource and/or computation time. Therefore, there is a need in the industry to address one or more of these shortcomings.

SUMMARY OF THE INVENTION

Embodiments of the present invention provide a method for preserving shapes in a solid model when distributing material during topological optimization with distance fields. Briefly described, a 3D geometric model of a part having a boundary shape is received. The geometric model is pre-processed to produce a variable-void distance field and to produce a frozen distance field representing the boundary shape. The geometric model is apportioned into a plurality of voxels, and a density value is adjusted for each voxel according to an optimization process. An iso-surface mesh is extracted from the voxel data, and an iso-surface distance field is generated from the extracted iso-surface mesh. A distance field intersection is derived between the iso-surface distance field and the variable-void distance field. A distance field union is performed between the distance field intersection and the frozen distance field, and a result iso-surface mesh is produced from the distance field union.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

FIG. 2A depict a topology optimized voxel model resulting from processing of the initial voxelized model of FIG. 1B by an optimization solver.

FIG. 2B shows a perspective view of a voxel extracted iso-surface mesh model resulting from processing of the topology optimized voxel model of FIG. 2A.

FIG. 2C shows a top view of the voxel extracted iso-surface mesh model of FIG. 2B.

FIG. 3A depicts a geometric block with selected frozen surfaces surrounding void regions.

FIG. 3B depicts a selection of thickened regions surrounding the selected frozen surfaces of FIG. 3A.

FIG. 3C depicts an isolated view of the thickened regions of FIG. 3B.

FIG. 5A shows the variable-void mesh of the initial geographic model of FIG. 1B in solid (top) and wireframe (bottom).

FIG. 5B shows the surface optimized iso-surface mesh in solid (top) and wireframe (bottom).

FIG. 5C shows the final Boolean iso-surface mesh in solid (top) and wireframe (bottom).

DETAILED DESCRIPTION

Figure 1B:
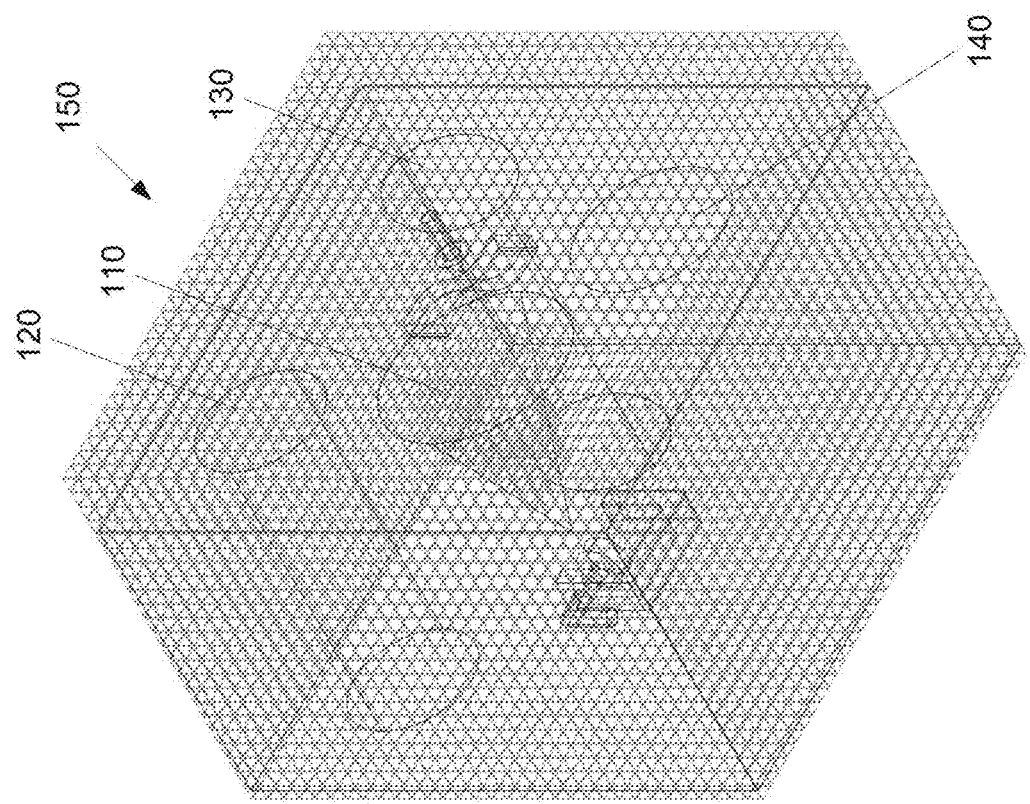
FIG. 1B is a schematic diagram showing a voxelization grid generated over the initial geometric model of FIG. 1A used to generate an initial voxelized model.

The following definitions are useful for interpreting terms applied to features of the embodiments disclosed herein, and are meant only to define elements within the disclosure.

As used within this disclosure, "solid modeling" generally refers to virtual manipulation of a model formed from a solid block of material to maintain selected physical features and voids, while removing unwanted material and/or adjusting the density of the remaining material to meet size and performance parameters. Herein, regions of the model are referred to as variable regions, void regions, and frozen regions. Variable regions refer to portions of the model where the material density may be varied according to model constraints. Void regions refer to portions of the model where there is no material present. Frozen regions are fixed material faces that the designer wishes to retain intact after optimization of the model.

As used within this disclosure, "voxels" refers to a set of uniform three dimensional blocks that may be used to approximate the mass of a three dimensionally modelled object. While the embodiments described herein generally refer to cube shaped voxels, voxels of a different shape may be used in alternative embodiments.

As used within this disclosure, a "mesh" refers to a mathematical fabric of triangles used to model a contiguous surface.

As used within this disclosure, a "solver" refers to a software module configured to receive parameters of a model and criteria for a desired manipulation of the model as input and derives an adjusted and/or manipulate output. Specific solvers may be directed to specific tasks, for example, the topology optimization solver described in detail herein is a voxel-based solver.

Reference will now be made in detail to embodiments of the present invention, examples of which are illustrated in the accompanying drawings. Wherever possible, the same reference numbers are used in the drawings and the description to refer to the same or like parts.

As noted in the background section, while optimization of material distribution in 3D models directly from FEM elements accurately retains specified boundaries, the process is computationally intensive, which may result in excessive use of computer resources and/or a long wait for results.

The embodiments described herein relate to a more efficient method to model a 3D object using regular voxel elements, for example cubes, for topology optimization. Voxels simplify topology optimization and manipulation of voxel operations are generally very efficient in terms of computer resource and time usage. After a voxel model has been adjusted for topology optimization/manipulation, for example, via a voxel based topology optimization solver 1024, the resulting voxel model may be further processed to obtain a smooth triangle or quad mesh through known iso-surface extraction methods such as a marching cubes method and/or a dual contour method. However, the iso-surface based upon the optimized voxel model generally does not accurately preserve boundary shapes of the desired model. The embodiments herein are directed to boundary shape preservation when using a voxel based solver.

Figure 10A:
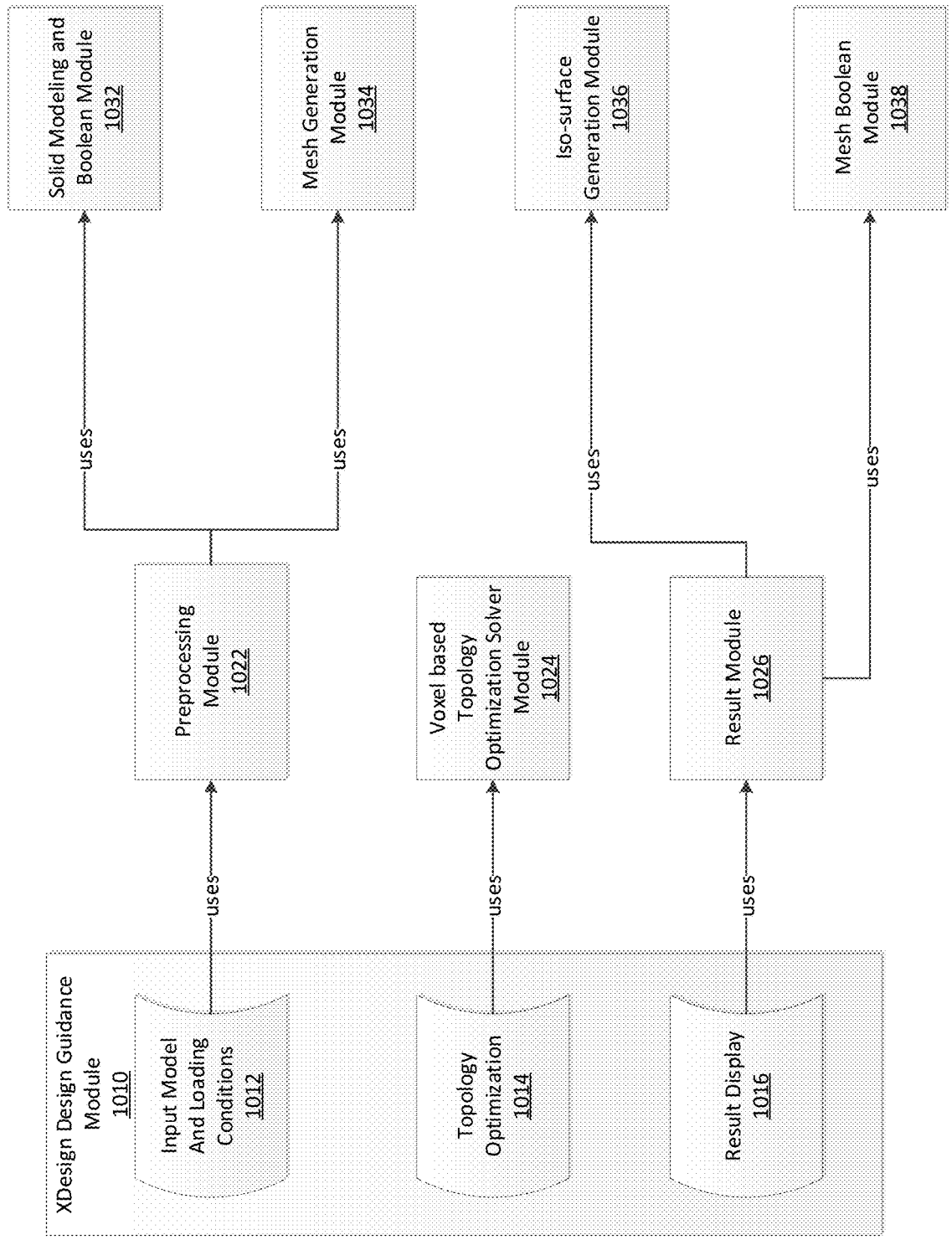
FIG. 10A is a block diagram of a system for executing the first method embodiment.

As shown by FIG. 10A, an XDesign design guidance function module 1010 uses the voxel based topology optimization solver 1024 to convert the initial geometric model 100 into a topology optimized model. Under the first embodiment shown by FIG. 10A, the XDesign design guidance function module 1010 includes sub-modules for input model and loading conditions 1012, topology optimization 1014, and result display 1016. The input model and loading conditions module 1012 uses a preprocessing module 1022. Under the first embodiment, as described further below, the preprocessing module 1022 uses a solid modeling and Boolean module 1032 and a mesh generation module 1034. The result module 1026 uses an iso-surface generation module 1036 and a mesh Boolean module 1038.

The initial geometric model 100, for example, a CAD model, is discretized into uniform voxel cubes, as shown by FIG. 1B. The XDesign design guidance function module 1010 uses three cases where local geometric shapes are used to preserve desired features in the topology optimization problem. These three cases correspond to three types of regions of the initial geometric model that user desires to preserve in the topology optimized model:

1. Variable regions: design space limited by some geometric models;
2. Void regions: required empty space limited by some geometric models; and
3. Frozen region: faces that the user wants to maintain after the optimization.

Each of the variable regions, void regions, and frozen regions are defined by geometric models and can be any shape. In general, the void regions and frozen regions are immutable, while the XDesign design guidance function module 1010 manipulates the variable regions to meet the desired physical and performance characteristics of the topology optimized model.

Users expect end results to maintain geometric shapes of the original void and frozen regions for accuracy. Since by their nature voxels merely represent an approximation of a volumetric model, the resulting voxel model does not accurately represent the defined regions. Any geometric models can only be discretized as a collection of small regular sized voxels which are called voxel models.

Figure 1A:
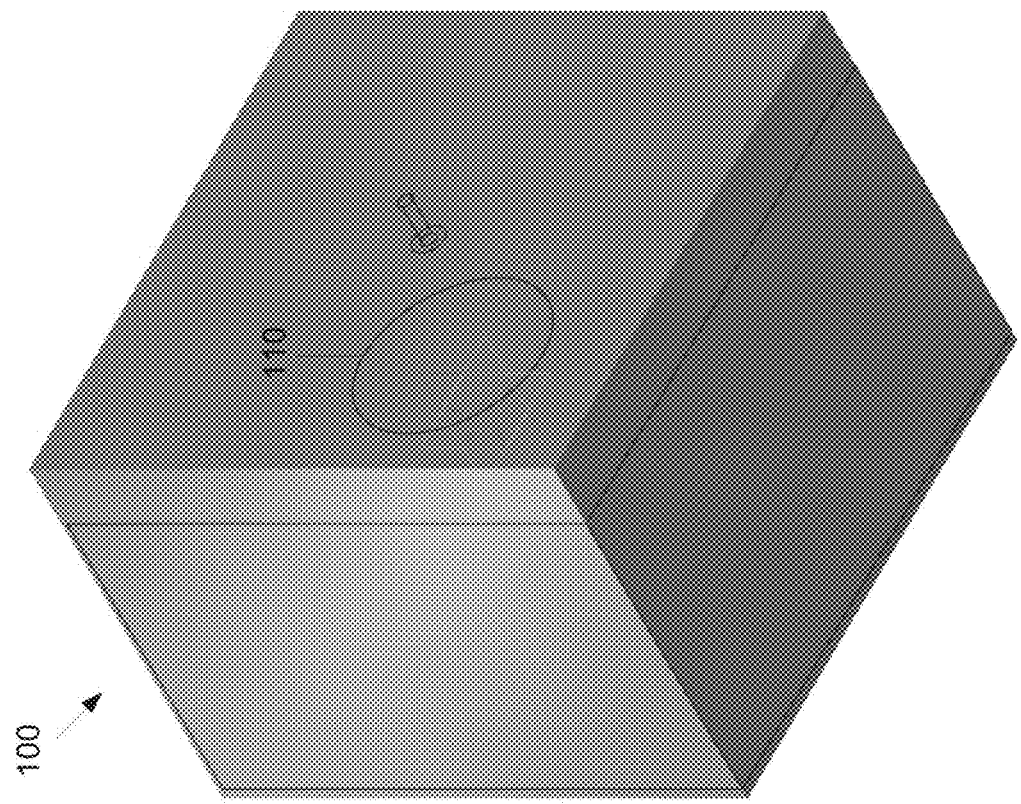
FIG. 1A is a schematic diagram showing an initial geometric model that defines a design space delimiting the boundaries of a finished model.

FIG. 1A is a schematic diagram showing an initial geometric model 100 that defines a design space delimiting the boundaries of a finished model. FIG. 1B is a schematic diagram showing a voxelization grid generated over the initial geometric model of FIG. 1A used to generate an initial voxelized model 150.

An optimization process redistributes the mass of the initial voxelized model 150 by changing the density of the voxels. As described further below, after topology optimization, in the result module 1026 (FIG. 10A) a threshold is calculated to filter out less important voxels and meet a user defined target mass reduction rate. The user can also manually adjust the threshold to add or remove voxels based upon design requirements. For example, the optimization process computes a voxel density parameter value for each voxel and sets a corresponding threshold above which a voxel may be retained and below which the voxel may be removed.

After optimization, some voxels are removed based on such thresholds, resulting in a topology optimized voxel model 200, however, the topology optimized voxel model 200 is generally still a collection of voxel blocks that only approximate the desired model and do not result in a smooth surface. To get smooth result, an iso-surface (triangle or quad mesh) is extracted from the voxel data of the topology optimized voxel model 200 resulting in a voxel extracted iso-surface mesh model 250. However, since voxels have been used to approximate the three types of regions, the resulting voxel extracted iso-surface mesh model 250 does not accurately represent the features of the initial geometric model 100. For example, there may be material missing at a surface boundary, that is, material that should extend up to the boundary does not because a voxel was removed, or there may be material protruding into an area intended to be void, where a portion of a retained voxel crosses the boundary and extends into the void region. The voxel extracted iso-surface mesh model 250 resulting from the optimization process does not accurately capture the desired surfaces.

FIG. 2A shows how the voxel approximation in the topology optimized voxel model 200 does not preserve the smooth surface of the initial geometric model 100. Even after smoothing, the voxel extracted iso-surface mesh model 250 likewise does not accurately represent the smooth surface of the initial geometric model 100. A cylindrical portion 120 is intended to have holes having a circular cross-section, and likewise an elliptical portion 130 is intended to have a smooth elliptical cross section. A concave area 140 is intended to be semi-spherical. As can be seen in FIGS. 2A-2C, the voxel extracted iso-surface mesh model 250 does not preserve the intended surface shapes of the initial geometric model 100.

The exemplary embodiments of the present invention provide a systematic and reliable method to preserve shapes in the results from the voxel based topology optimization solver 1024 by using geometry Boolean operations to preserve shapes. Two exemplary embodiments provide distinct implementations. A first exemplary method embodiment uses a mesh Boolean approach, which defines the three types of regions and discretize them into meshes. A manifold iso-surface mesh is generated from the voxel based topology optimization solver 1024 result. A series of mesh Boolean operations is used to finalize the result, accurately preserving required shapes in the resulting model.

A second exemplary method embodiment uses distance field Boolean approach. At a high level, under the second embodiment the three types of regions are defined to generate directed distance fields. The voxel based topology optimization solver 1024 result generates an iso-surface mesh having a corresponding directed distance field. A series of directed distance field Boolean operations are used to provide a final directed distance field, and an iso-surface mesh is generated from the final directed distance field, accurately preserving void/frozen boundary regions from the initial geometric model 100 in the resulting model.

The first exemplary method embodiment (mesh Boolean), may be described as a series of the following general steps. First, a pre-processing module 1022 (FIG. 10A) combines the variable, void, and frozen regions and mesh generation of related geometric models. Voxel data are collected from the regions and optimized by the topology optimization solver module 1024 (FIG. 10A) to produce an optimized voxel model having voxels with assigned density values. An iso-surface generation module 1036 extracts an iso-surface mesh from the optimized voxel model based upon a given threshold value. Finally, a mesh Boolean module 1038 uses mesh Boolean operations to polish the iso-surface to produce preserved shapes of the geometric models.

Given a geometric model 100, for example a box or another shape, for a standard topology optimization problem a user first defines a variable region within the geometric model 100. The user defines an applied load and/or applies a constraint to one or more faces, edges, and/or vertices of the geometric model 100. Additionally, the user may identify one or more surfaces be kept (frozen regions) and regions that may be required to be empty (void regions that have no material). Each of these regions may be represented as a geographic model, and each of the geometric models is triangulated into meshes for post processing. In a pre-processing module, solid modeling Boolean operations are used including intersection, union, and subtraction. Given two solid models $M_1$ and $M_2$ in 3D space, the three Boolean operations are defined as Intersection is all the points $\vec{p}$ in 3D space $R^3$ that belong to $M_1$ and $M_2$:

$$M_1 \cap M_2 = \{\vec{p} \in R^3 | \vec{p} \in M_1 \text{ and } \vec{p} \in M_2\} \quad \text{(Eq. 1)}$$

Union is all the points $\vec{p}$ in 3D space $R^3$ that belong to $M_1$ or $M_2$ $$M_1 \cup M_2 = \{\vec{p} \in R^3 | \vec{p} \in M_1 \text{ or } \vec{p} \in M_2\} \quad \text{(Eq. 2)}$$

Subtraction is all the points $\vec{p}$ in 3D space $R^3$ that belong to $M_1$ but not $M_2$:

$$M_1 \setminus M_2 = \{\vec{p} \in R^3 | \vec{p} \in M_1 \text{ and } \vec{p} \notin M_2\} \quad \text{(Eq. 3)}$$

Boolean operations are standard functions of solid modeling. The processing of variable and void regions is described with respect to FIG. 4A as follows. For variable regions, all the selected variable region geometric models 410 are unioned into one combined variable region 420. For void regions, all the selected void geometric models 415 are unioned into one void model 425. The void region union model 425 is subtracted from the variable region union model 420 as shown by block 430. The resulting geometric model is triangulated via a mesh generation module 440 into a variable-void mesh 450.

The processing of frozen regions is described with respect to FIG. 4B and FIGS. 3A-3C as follows. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

The user selects faces of one or more frozen regions 120, 130, 140 within a block 100 as shown by block 460. The user assigns a thickness of an area of material to keep, for example, by defining a volume including a portion of the block material 100 surrounding the desired void region, as shown by block 465. Through solid modeling thickening method, the faces 120, 130, 140 are thickened into solid models. The thickening direction is towards the inside of the belonging model and if a face 120, 130, 140 is thickened beyond the boundary of the belonging model, extra volume has to be cut so only the intersection (Boolean operation) of the thickened model and the belonging model are kept, as shown by block 470. The thickened models for each face 120, 130, 140 are unioned to form one frozen model including thickened portions 320, 330, 340 corresponding to the selected faces 120, 130, 140. Finally, the frozen model is discretized by a mesh generation module 480 into a variable-void mesh 300, as shown by block 490. The above described preprocessing combines the geometric models for triangulation in preparation for performance of post-processing, described in detail below.

A cubic design space is calculated according to the setup of the topology optimization problem. For the voxel based topology optimization solver 1024, each of the geometric models is discretized by regularly sized voxels, for example, cubes. For example, a cubic design space is partitioned into 32*32*32 voxels or 64*64*64 voxels. In other examples, higher resolutions may be used, for example 128*128*128, 256*256*256. Each voxel is assigned a density value between 0 and 1. According to the density of material in the geometric model occupied by the corresponding voxel. A 0 density indicates there is no material or void region within the voxel dimension, while 1 means the voxel dimension is full of material or, the voxel includes a frozen region.

For a variable region, all the voxels that are mapped inside and/or on any boundary of the geometric model are collected and marked as including variable material. The density values of the voxels marked as variable may be adjusted by the voxel based topology optimization solver 1024.

For a void region, all the voxels that map to portions of the geometric model where no material is to be included are collected and marked with fixed zero material (value 0).

For a frozen region, all the voxels that touch the selected faces are marked as full material (value 1). This ensures that all portions of the frozen regions are encompassed by a full material voxel.

The information ensures the voxel based topology optimization solver 1024 produces a voxel result according to the region partition.

The relation between a geometric model and voxels may be determined in different ways. For example, the display triangle mesh of the model to test may be used to test with voxels. Each triangle of the mesh is the boundary of the model and the voxels touching the triangle are the boundary of the original model. All the mesh triangles may be traversed to find all the voxels on the boundary. To collect all the interior voxels, start from an inside voxel and iteratively search all the neighbors bounded by the boundary voxels.

The voxel based topology optimization solver 1024 receives the initial density values of voxels and loading conditions as input. As described further below, the voxel based topology optimization solver 1024 is configured to minimize compliance of a model constrained by a user defined maximum mass. The voxel based topology optimization solver 1024 produces an output having density values of voxels corresponding to a computed preferred result.

The voxel based topology optimization solver 1024 minimizes compliance of a model by iteratively changing the density values of the voxels marked as belonging to variable region, that is having a value between but not including 0 and 1. The voxel based topology optimization solver 1024 may assign different density values for different variable region voxels. Density values may be viewed as indicating the relative importance of each voxel. The smaller the density value is, the less important the voxel is. The greater the density value is, the more important the voxel is.

The voxel based topology optimization solver 1024 modifies the density values for voxels in the variable region. The voxels of the void region always have density value of 0. The voxels of the frozen region always have density value of 1.

The voxel based topology optimization solver 1024 solves the following optimization problem:

$$\min_x c(x) = U^T K(x) U$$

$$\text{subject to:} \begin{cases} \frac{V(x)}{V_0} \leq r \\ K(x)U = F \\ 0 \leq x \leq 1 \end{cases}$$

Where U is the displacement vector and F is the force vector. K(x) is the stiffness matrix which is a function of density value vector x. V(x) is material mass and $V_0$ is initial material mass. r is a fixed user assigned mass reduction ratio.

The objective is to find the density values vector x that minimizes the compliance $c(x)=U^T K(x)U$ subject to the constraints 1. Mass ratio is not greater than the user assigned mass reduction ratio, 2. Loading condition is satisfied. 3. Density values are between 0 and 1.

The output of the voxel based topology optimization solver 1024 is an array of density data for all of the voxels. The user may then set a density threshold between 0 and 1 to filter out voxels with small values and keep those with larger values. The density mapped voxel model may be converted into a mesh surface using a traditional marching cubes method to produce a mesh of triangles. Subsequently, a manifold mesh can be generated as an iso-surface. The resulting topology optimized iso-surface mesh 250 (FIG. 5B) is a triangle mesh.

At a variable region boundary, for example, a boundary between a variable region and a frozen region or a boundary between the variable region and a void region, the iso-surface can extend outside the variable region within one voxel size. At the void region boundary, the iso-surface may extend within the void region within one voxel size. At the frozen region, the iso-surface can extend beyond the frozen region within one voxel size. The resulting iso-surface may be seen as a rough approximation of the original variable, void, and frozen regions.

FIGS. 5A-5B show the inputs of the mesh Boolean technique, while FIG. 5C shows the output. For each of FIGS. 5A-5C, a solid rendering is shown in the top figure and a wireframe rendering is shown below. As shown by FIGS. 5A-5C, Mesh Boolean techniques may be applied, for example by a mesh Boolean module, to remove the surface material irregularities of the iso-surface resulting from the voxel model conversion. Mesh Boolean operations are similar to solid modeling Boolean operations. Mesh Boolean operations such as intersection, union, and subtraction may be applied to triangle or quad mesh. The mesh Boolean model performs a mesh intersection between the topology optimized iso-surface mesh 250 and the variable-void mesh 100 to produce a resulting mesh (not shown), and then performs a mesh union between the result meshing and the frozen mesh 300. All boundary shapes are preserved accurately in the final mesh 500.

Figure 6:
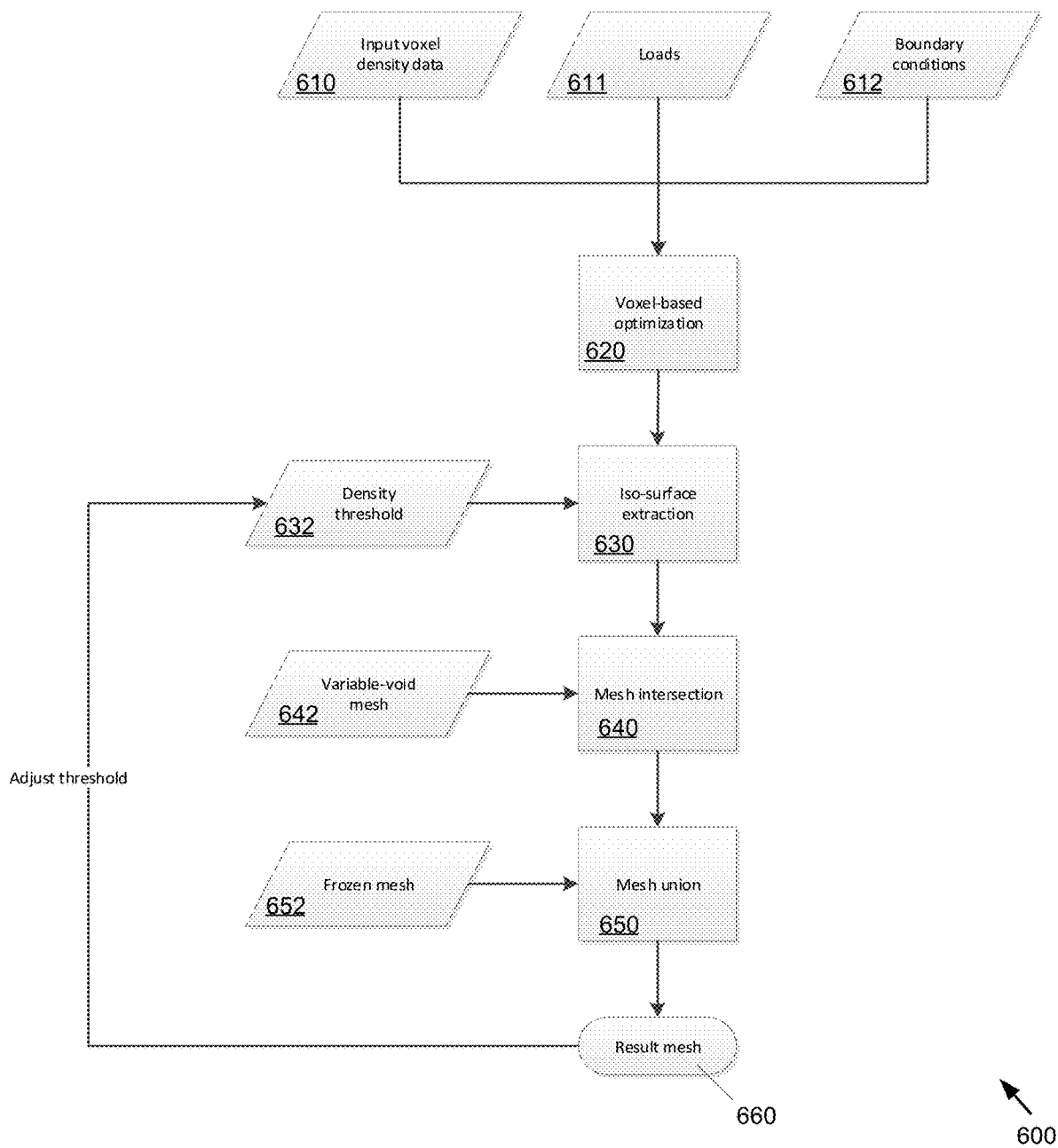
FIG. 6 is a diagram illustrating iterative threshold adjustment under the first method embodiment.

The user may increase the voxel density threshold to allow more material or more voxels, or reduce the voxel density to include less material or fewer voxels for iso-surface extraction. For example, adjusting the voxel density may be implemented as an iterative process for users. If the density threshold is modified, the topology optimized iso-surface mesh 250 is re-generated and the mesh Boolean is re-performed with the variable-void mesh 100 and the frozen mesh 300 to generate the final result 500, as shown by FIG. 6. Input voxel density data 610, load data 611, and boundary conditions 612 are provided to the voxel based topology optimization solver 1024 module to generate a voxel based model by optimizing the input parameters, as shown by block 620. An iso-surface model is generated from the voxel based model, as shown by block 630. A mesh intersection model is produced by a mesh binary intersection of the iso-surface model and the variable-void mesh 642, as shown by block 640. A result mesh 660 is produced by a mesh binary union of the mesh intersection model and the frozen mesh 652, as shown by block 650. The result mesh

660 may be iteratively adjusted by adjusting the density threshold 632 and repeating blocks 630, 640, and 650.

Under a second embodiment of a method for optimizing the surface of a 3D CAD model, directed distance field method and its Boolean operations are used instead of using mesh Boolean (as per the first embodiment) to get the final result. The advantage of distance field Boolean is simplicity and speed. Under the second embodiment directed distance fields are generated from each of the three input regions (variable, void, and frozen) and the final iso-surface mesh. Directed distance field Boolean operations are used to generate final iso-surface mesh which preserves the required shapes.

Figure 10B:
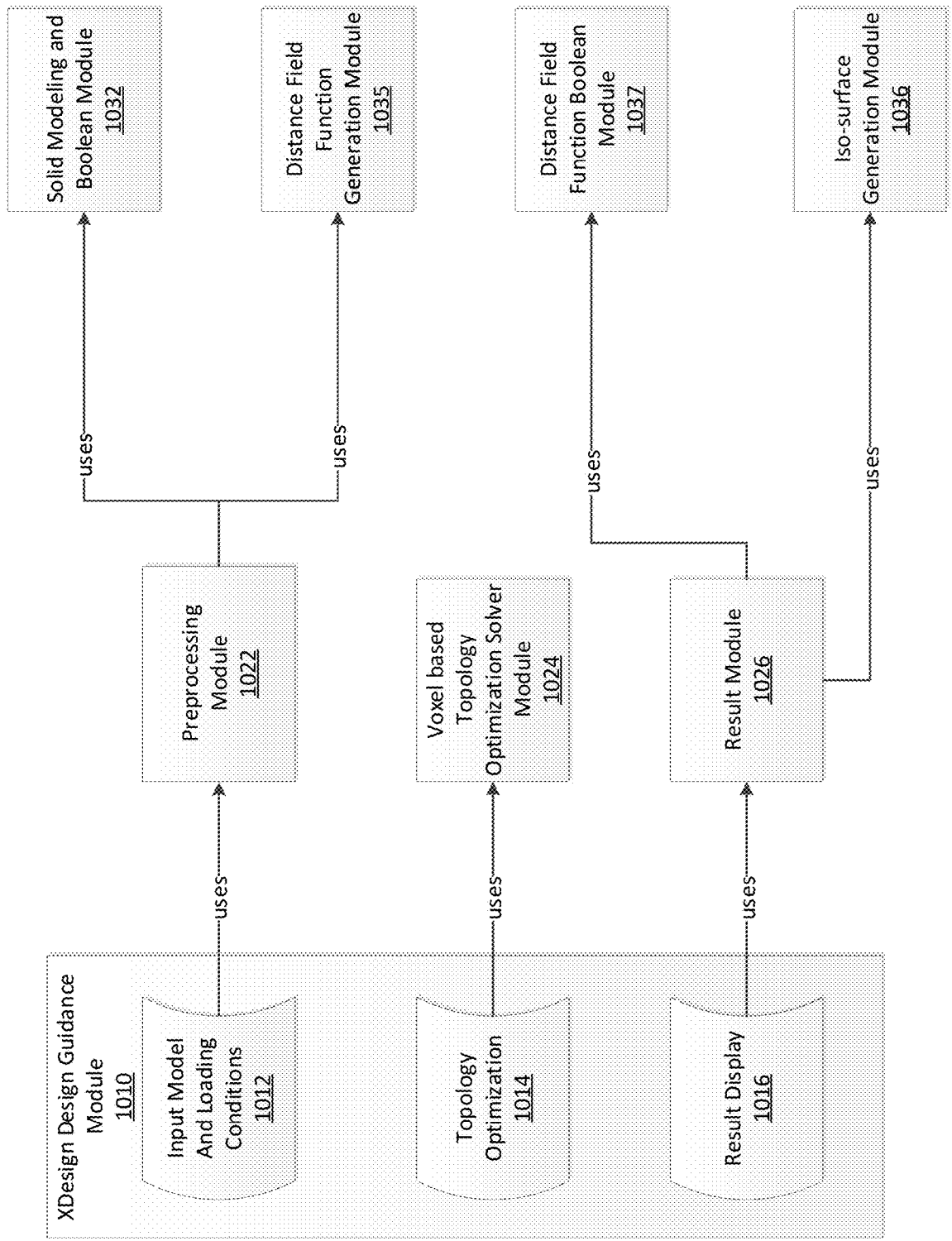
FIG. 10B is a block diagram of a system for executing the second method embodiment.

As shown by FIG. 10B, as per the first embodiment, under the second embodiment the XDesign design guidance function module 1010 uses the voxel based topology optimization solver 1024 to convert the initial geometric model 100 into a topology optimized model. The XDesign design guidance function module 1010 includes sub-modules for input model and loading conditions 1012, topology optimization 1014, and result display 1016. The input model and loading conditions module 1012 uses a preprocessing module 1022. Under the second embodiment, as described further below, the preprocessing module 1022 uses a solid modeling and Boolean module and a distance field function module 1035. The result module 1026 uses the iso-surface generation module 1036 and a distance field function Boolean module 1037. A solid geometric model is enclosed by a plurality of closed surfaces. A closed surface S in space may be represented by a function $f(x, y, z)=0$, $(x, y, z) \in S$. This function is not unique. One natural choice is signed distance field $f(x, y, z)=Dist((x, y, z), S)$, $(x, y, z) \in R^3$ which is signed distance from a point $(x, y, z)$ to the surface S. If the point is outside the model, the distance is positive. If a point is inside the model, the distance is negative. Give two surfaces $S_1$ and $S_2$ and their signed distance field functions $f_1$ and $f_2$, the three Boolean operations can be represented as $$\text{Intersection: } \max(f_1(x,y,z), f_2(x,y,z))=0 \quad \text{(Eq. 4)}$$

$$\text{Union: } \min(f_1(x,y,z), f_2(x,y,z))=0 \quad \text{(Eq. 5)}$$

$$\text{Subtraction: } \max(f_1(x,y,z), -f_2(x,y,z))=0 \quad \text{(Eq. 6)}$$

Assuming a geometric model is voxelized, as described above regarding the first embodiment, the signed distance function can be sampled at the center of voxels of the distance field voxel model in design space, generating a vector of distance values for each of the voxels of the distance field voxel model. The voxel based topology optimization solver 1024 generates the distance data for each voxel of the distance field voxel model in a manner similar to the output density data of the first embodiment. A field distance iso-surface is then extracted from the distance field voxel model.

A signed distance field does not keep sharp or crease features. Instead, a directed distance field method is an extension that preserves features. Extended from a scalar distance, a vector of three distance values along x, y and z axes is used to define a directed distance field $$f(x, y, z) = \begin{bmatrix} Dist_x((x, y, z), S) \\ Dist_y((x, y, z), S) \\ Dist_z((x, y, z), S) \end{bmatrix}, (x, y, z) \in R^3 \quad \text{(Eq. 7)}$$

$Dist_i((x, y, z), S)$ is a signed distance function along i axis, where the i-axis is the x, y, or z axis. Boolean operations can also be extended to each of the x, y, z axis. For example, intersection between $S_1$ and $S_2$ is $$\begin{bmatrix} \max(Dist_{1x}(x, y, z), Dist_{2x}(x, y, z)) \\ \max(Dist_{1y}(x, y, z), Dist_{2y}(x, y, z)) \\ \max(Dist_{1z}(x, y, z), Dist_{2z}(x, y, z)) \end{bmatrix} = 0 \quad \text{(Eq. 8)}$$

Under the second embodiment, directed distance values are easier to calculate than scalar signed distance of the first embodiment because the distance directions are known. From any point along x, y, or z direction, a ray can be cast to intersect with a surface and then distance can be calculated to the intersection points.

Figure 4A:
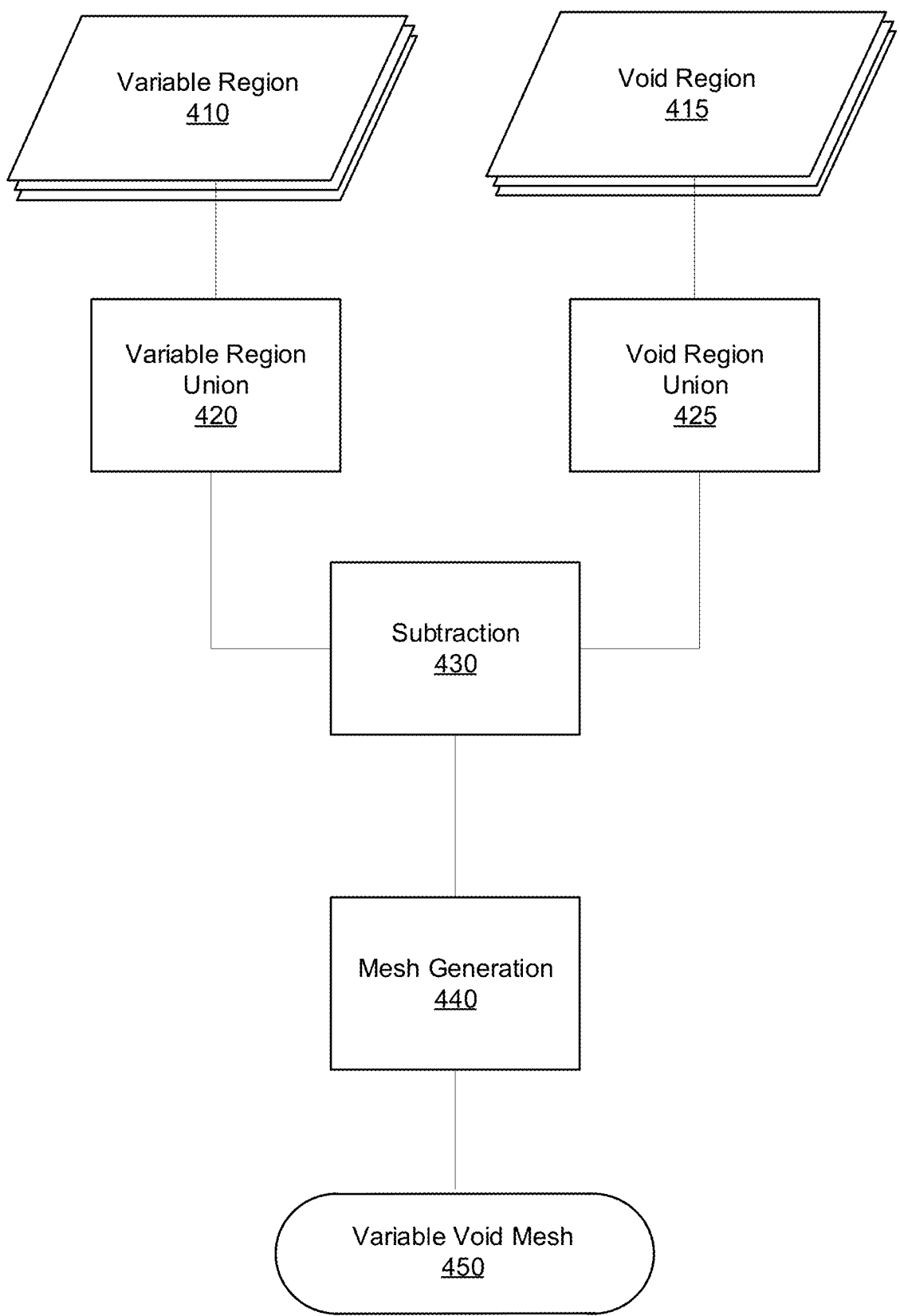
FIG. 4A is a flowchart depicting pre-processing of a variable-void mesh under the first embodiment.
Figure 4B:
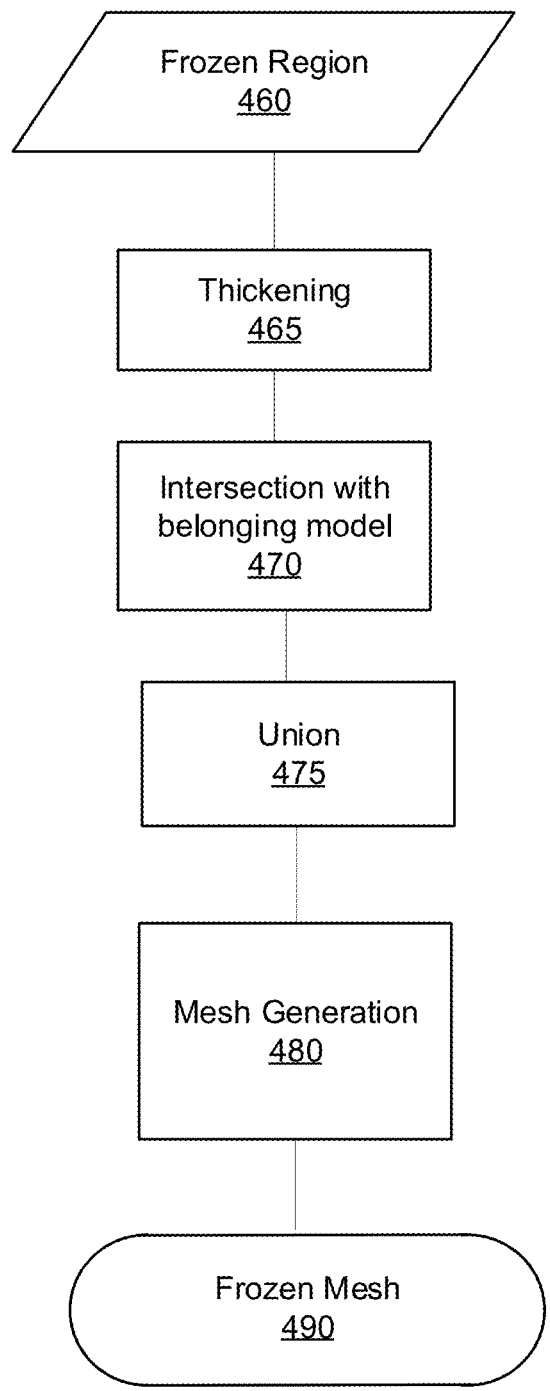
FIG. 4B is a flowchart depicting pre-processing of a frozen mesh under the first embodiment.
Figure 7A:
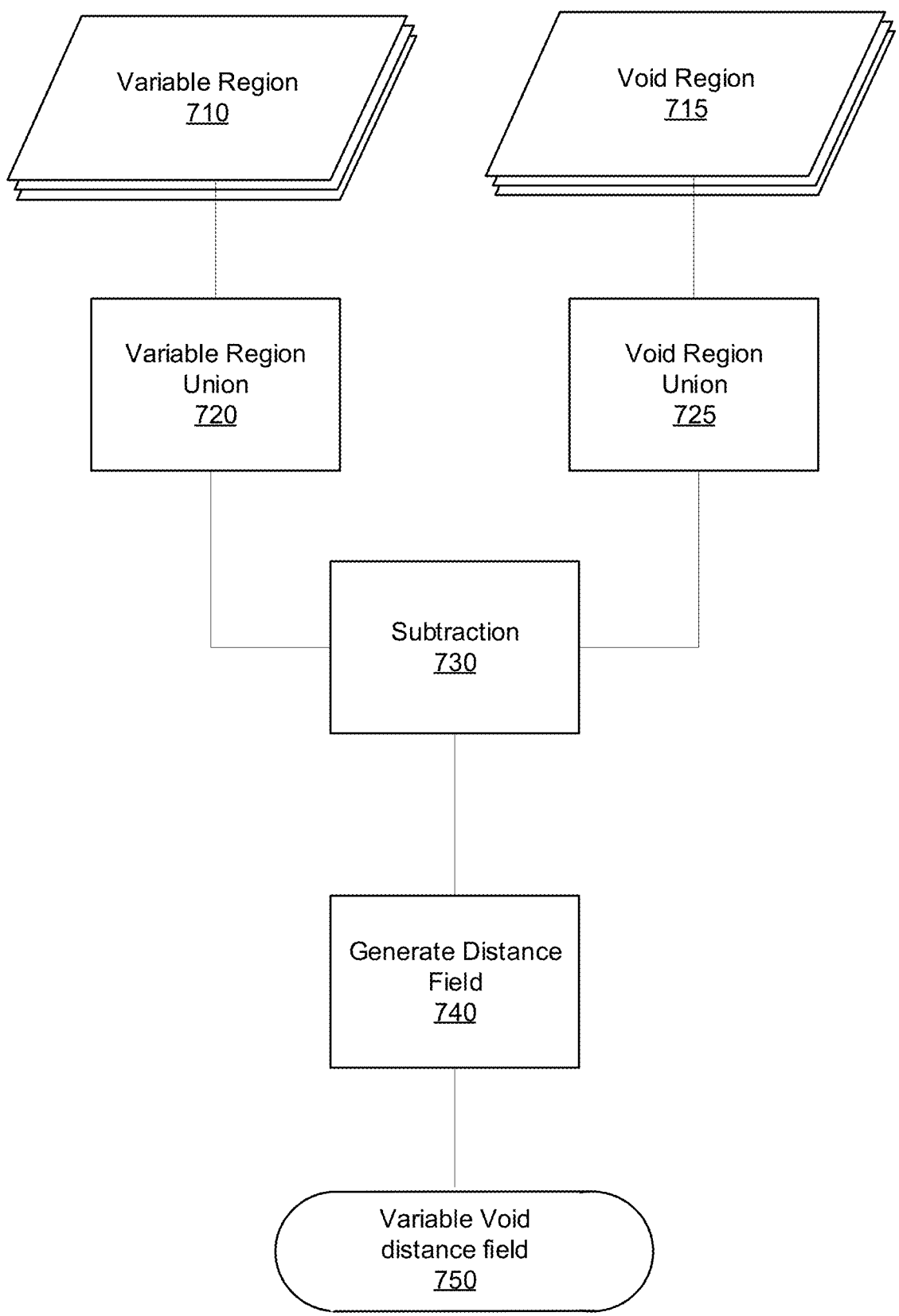
FIG. 7A is a flowchart depicting pre-processing of a variable-void mesh under the second embodiment.
Figure 7B:
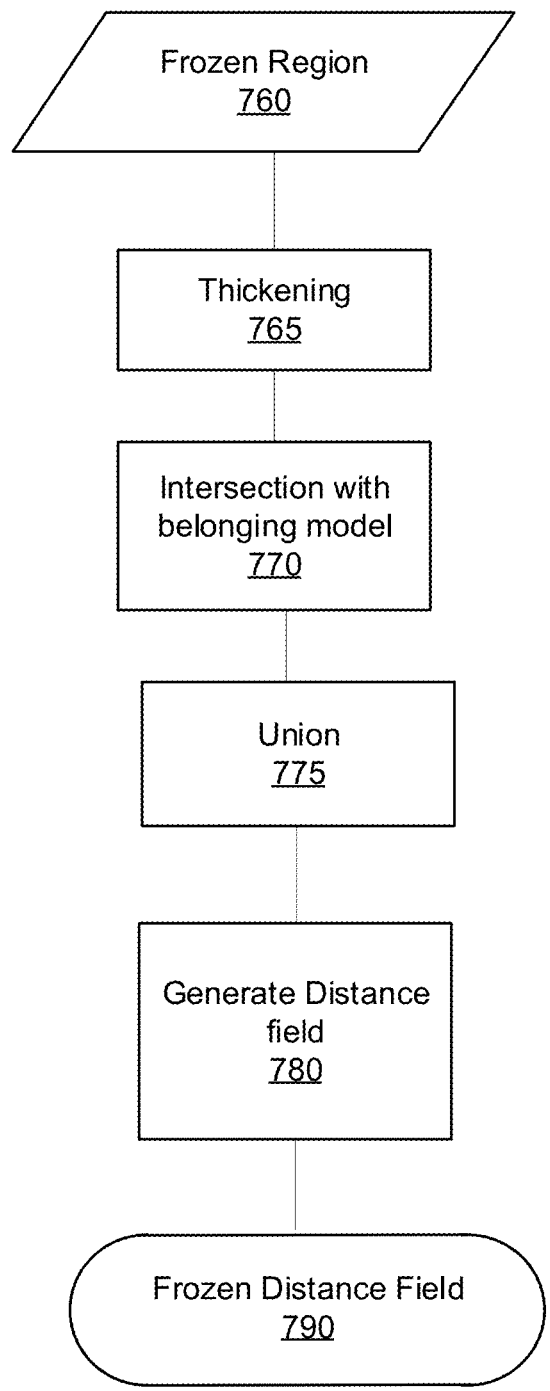
FIG. 7B is a flowchart depicting pre-processing of a frozen mesh under the second embodiment.

The steps of the directed distance field method of the second embodiment are shown in FIGS. 7A and 7B, which are discussed below with reference to FIGS. 4A and 4B to highlight the differences between the first embodiment (FIGS. 4A-B) and the second embodiment (FIGS. 7A-B). Under the second embodiment preprocessing shown in FIG. 7A, a variable-void distance field is generated instead of a mesh. Similarly, under FIG. 7B a frozen distance field is generated instead of a mesh. Directed distance fields are directly generated from the variable-void model and the frozen model. Voxel data are collected from the regions and optimized by a solver module to produce an optimized voxel model. For variable regions, all the selected variable region geometric models 710 are unioned into one combined variable region 720. For void regions, all the selected void geometric models 715 are unioned into one void region union model 725. The void region union model 725 is subtracted from the variable region union model 720 as shown at block 730. It should be noted that blocks 710, 715, 720, 725, and 730 are substantially similar to blocks 410, 415, 420, 425, and 430 of the first embodiment. After an iso-surface mesh is obtained from the solver result, a directed distance field generation block 740 produces a variable-void iso-surface distance field, as shown by block 750.

As shown by FIG. 7B, under the second embodiment, processing of the frozen regions is similar to the first embodiment (FIG. 4B), except a distance field is generated as the end product instead of a mesh. The user selects faces of one or more frozen regions 120, 130, 140 within a block 100 as shown by block 760. The user assigns a thickness of an area of material to keep, for example, by defining a volume including a portion of the block material 100 surrounding the desired void region, as shown by block 765. Through solid modeling thickening method, the faces 120, 130, 140 are thickened into solid models. The thickening direction is towards the inside of the belonging geometry and if a face 120, 130, 140 is thickened beyond the boundary of the belonging model, extra volume has to be cut, that means keep only the intersection (Boolean operation) of the thickened model and the belonging model, as shown by block 770. The thickened models for each face 120, 130, 140 are unioned to form one frozen model including thickened portions 320, 330, 340 corresponding to the selected faces 120, 130, 140. Finally discretize the frozen model is discretized by a distance field generation module 780 into a variable-void distance field 300, as shown by block 790. The above described preprocessing combines the geometric models for triangulation in preparation for performance of post-processing, described in detail below.

Under the second embodiment distance field Boolean techniques may be applied instead of mesh Boolean operations, for example by a distance field function Boolean module 1037, to remove the surface material irregularities of the iso-surface resulting from the voxel model conversion. Distance field Boolean operations such as intersection, union, and subtraction may be applied to triangle or quad mesh. The distance field function Boolean model 1037 performs a distance field intersection between the topology optimized iso-surface distance field and the variable-void distance to produce a resulting distance field (not shown), and then performs a distance field union between the result distance field and the frozen distance field. All boundary shapes are preserved accurately in the final distance field.

Figure 8:
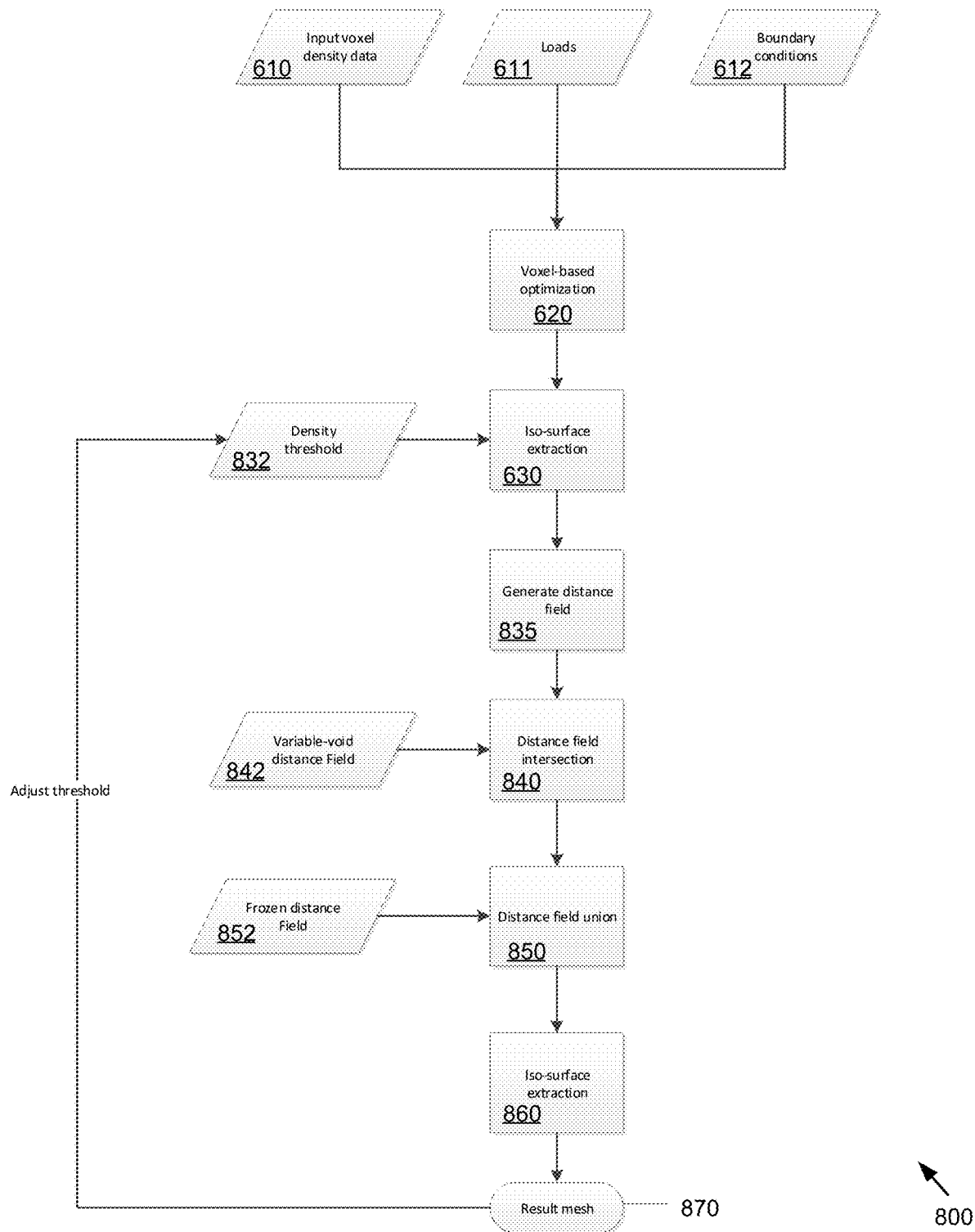
FIG. 8 is a diagram illustrating iterative threshold adjustment under the second method embodiment.

As with the first embodiments, the user may increase the voxel density threshold to allow more material or more voxels, or reduce the voxel density to include less material or fewer voxels for iso-surface extraction. For example, adjusting the voxel density may be implemented as an iterative process for users. If the density threshold is modified, the topology optimized iso-surface mesh 250 is re-generated and the distance field Boolean is re-performed with the variable-void distance field and the frozen distance field 300 to generate the final result, as shown by FIG. 8. Input voxel density data 610, load data 611, and boundary conditions 612 are provided to a voxel-based solver module to generate a voxel based model by optimizing the input parameters, as shown by block 620. An iso-surface model is generated from the voxel based model, as shown by block 630. Distance field data is generated for the iso-surface model, as shown by block 835. A distance field intersection model is produced by a distance field binary intersection of the generated distance field and a variable-void distance field 842, as shown by block 840. A result distance field is produced by a distance field binary union of the variable-void intersection model and a frozen distance field 852, as shown by block 850. A result mesh 870 is produced from the result distance field by iso-surface extraction, as shown by block 860. The result mesh 870 may be iteratively adjusted by adjusting the density threshold 632 and repeating blocks 630, 835, 840, 850, and 860. To better support sharp or crease geometric features in the original model, either an extended marching cubes method or a dual contour method may be used.

Figure 9:
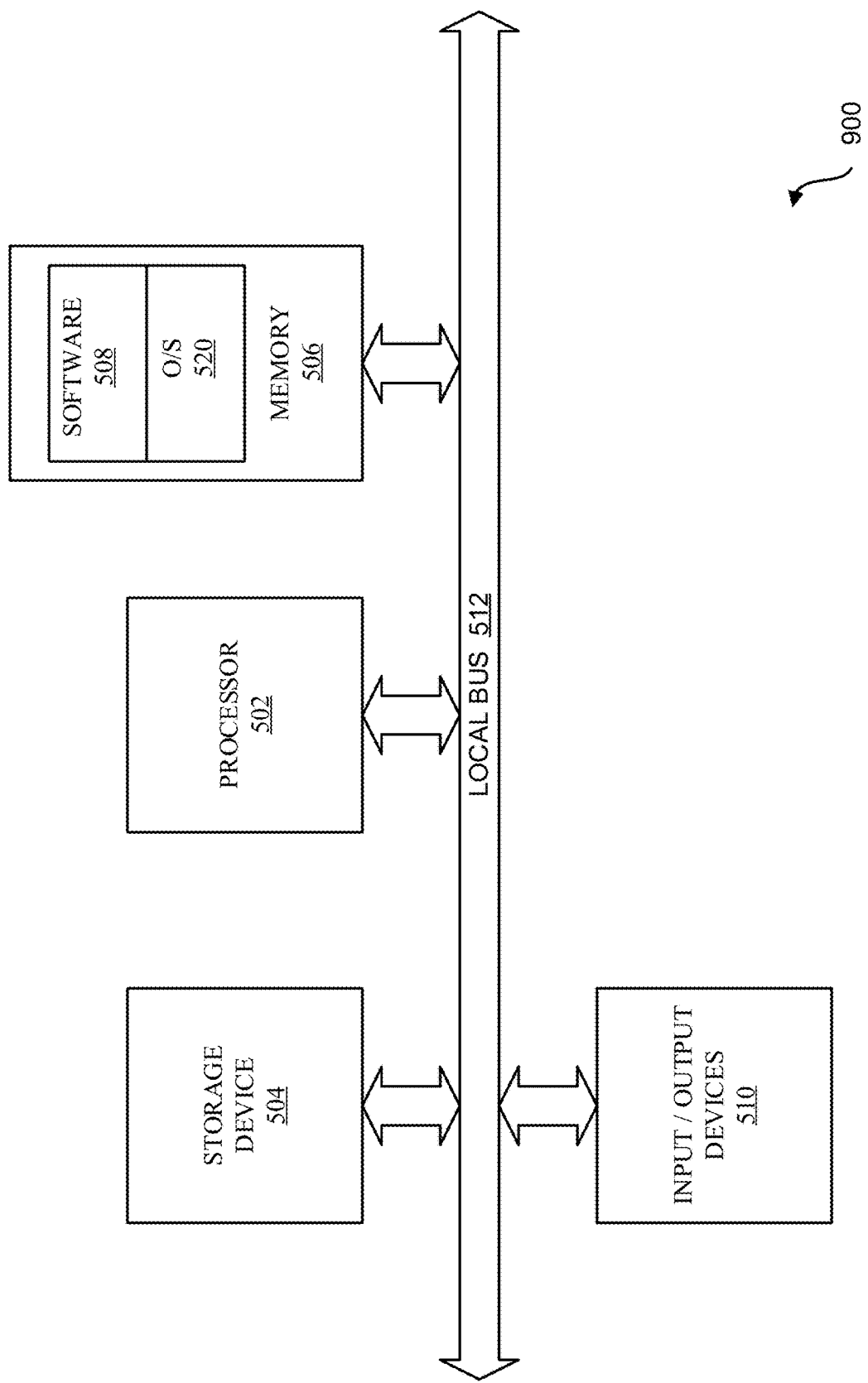
FIG. 9 is a schematic diagram illustrating an example of a system for executing functionality of the present invention.

As previously mentioned, the present system for executing the functionality described in detail above may be a computer, an example of which is shown in the schematic diagram of FIG. 9. The system 900 contains a processor 502, a storage device 504, a memory 506 having software 508 stored therein that defines the abovementioned functionality, input and output (I/O) devices 510 (or peripherals), and a local bus, or local interface 512 allowing for communication within the system 900. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 900, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 900, in accordance with the present invention. The software 508 in the memory 506 may include one or more separate programs, each of which contains an ordered listing of executable instructions for implementing logical functions of the system 900, as described below. The memory 506 may contain an operating system (O/S) 520. The operating system essentially controls the execution of programs within the system 900 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 900 is in operation, the processor 502 is configured to execute the software 508 stored within the memory 506, to communicate data to and from the memory 506, and to generally control operations of the system 900 pursuant to the software 508, as explained above.

When the functionality of the system 900 is in operation, the processor 502 is configured to execute the software 508 stored within the memory 506, to communicate data to and from the memory 506, and to generally control operations of the system 900 pursuant to the software 508. The operating system 520 is read by the processor 502, perhaps buffered within the processor 502, and then executed.

When the system 900 is implemented in software 508, it should be noted that instructions for implementing the system 900 can be stored on any computer-readable medium for use by or in connection with any computer-related device, system, or method. Such a computer-readable medium may, in some embodiments, correspond to either or both the memory 506 and the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system 900 is implemented in hardware, the system 900 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A computer based method comprising the steps of:
    receiving a 3D geometric model of a part, the geometric model comprising an initial boundary shape;
    pre-processing the geometric model to produce a variable-void distance field, further comprising the steps of:
        defining a variable model comprising a variable region of the geometric model where a material density is variable;
        defining a void model comprising a void region of the geometric model where material is absent;
        subtracting the void model from the variable model to create a variable-void model; and
        generating the variable-void distance field from the variable-void model;
    pre-processing the geometric model to produce a frozen distance field representing a subset of the initial boundary shape, further comprising the steps of:
        defining a frozen region further comprising at least one selected face of the initial boundary shape;
        thickening each of the at least one faces of the frozen region;
        combining each of the at least one thickened faces into a frozen model; and
        deriving the frozen distance field from the frozen model;
    apportioning the geometric model into a plurality of voxels;
    adjusting a density value for each voxel of the plurality of voxels according to an optimization process;
    extracting an extracted iso-surface mesh from the voxel data;
    generating an extracted iso-surface distance field from the extracted iso-surface mesh;
    deriving a distance field intersection between the iso-surface distance field and the variable-void distance field;
    performing a distance field union between the distance field intersection and the frozen distance field; and
    producing a result iso-surface mesh from the distance field union,
    wherein the variable-void distance field represents the void region of the geometric model and the variable density region of the geometric model, adjusting the density value for each voxel by the optimization process comprises changing the density value of voxels of the variable region to a value between but not including 0 and 1, and the distance field union between the distance field intersection and the frozen distance field preserves the frozen region in the result iso-surface mesh.

2. The method of claim 1, further comprising the steps of:
    defining a plurality of variable regions;
    combining the plurality of variable regions into the variable model;
    defining a plurality of void regions; and
    combining the plurality of void regions into the void model.

3. The method of claim 1, wherein each of the variable-void distance field, the frozen distance field, and the extracted iso-surface distance field comprises a directed distance field.

4. The method of claim 1, wherein adjusting the voxel density according to an optimization process further comprises the steps of:
    assigning an initial density value for each voxel of the plurality of voxels; and
    adjusting the voxel density values to minimize an overall model compliance.

5. The method of claim 4, further comprising the step of setting an initial voxel density threshold value below which a voxel is excluded.

6. The method of claim 5, further comprises the step of iteratively adjusting the voxel density threshold value.

7. The method of claim 1, wherein the 3D geometric model comprises a boundary representation (Brep).

* * * * *